United States Patent
Mizushima et al.

(10) Patent No.: US 10,067,828 B2
(45) Date of Patent: Sep. 4, 2018

(54) MEMORY CONTROLLER AND DATA CONTROL METHOD

(71) Applicant: Hitachi, Ltd., Tokyo (JP)

(72) Inventors: Nagamasa Mizushima, Tokyo (JP); Atsushi Kawamura, Tokyo (JP); Hideyuki Koseki, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 15/506,197

(22) PCT Filed: Oct. 3, 2014

(86) PCT No.: PCT/JP2014/076592
§ 371 (c)(1),
(2) Date: Feb. 23, 2017

(87) PCT Pub. No.: WO2016/051599
PCT Pub. Date: Apr. 7, 2016

(65) Prior Publication Data
US 2017/0300381 A1 Oct. 19, 2017

(51) Int. Cl.
*G06F 11/00* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0619; G06F 3/064; G06F 3/0679
See application file for complete search history.

(56) References Cited

U.S. PATENT DOCUMENTS 8,069,396 B2    11/2011   Chen et al.
8,112,692 B2*   2/2012   Lee .................... G06F 11/1068
                                                                         365/185.09
(Continued)

FOREIGN PATENT DOCUMENTS

JP   2003-131954 A   5/2003
JP   2004-152194 A   5/2004
(Continued)

OTHER PUBLICATIONS

International Search Report and Written Opinion for PCT App No. PCT/JP2014/076592 dated Nov. 25, 2014, 9 pgs.

*Primary Examiner* — Esaw T Abraham
(74) *Attorney, Agent, or Firm* — Procopio, Cory, Hargreaves & Savitch LLP

(57) ABSTRACT

A memory controller includes an error check correction circuit performing a calculation regarding an error correction code of data, and a processor using the error check correction circuit and write the data with the error correction code to a non-volatile memory (NVM) when writing the data to the NVM, while performing error correction of the data using the error correction code when reading the data from the NVM. The processor counts the number of error bits of the data stored in a block that is a unit of batch-erasure of the data, stores the data in the block with a first error correction code having an error correction ability, and stores the data in the block with a second error correction code having an error correction ability higher than the first error correction code when the number of the error bits is larger than a value.

8 Claims, 11 Drawing Sheets

(51) Int. Cl.
  *G11C 29/52*   (2006.01)
  *G06F 3/06*    (2006.01)
(52) U.S. Cl.
  CPC .......... *G06F 3/0652* (2013.01); *G06F 3/0679* (2013.01); *G11C 29/52* (2013.01)

(56) References Cited

U.S. PATENT DOCUMENTS

| | | | | |
|---|---|---|---|---|
| 8,307,257 B2* | 11/2012 | Poirrier | ............... | H03M 13/353 |
| | | | | 714/759 |
| 8,427,875 B2* | 4/2013 | Yang | ........................ | G06F 3/064 |
| | | | | 365/185.03 |
| 8,473,812 B2* | 6/2013 | Ramamoorthy | .... | G06F 11/1068 |
| | | | | 365/185.09 |
| 8,484,542 B2* | 7/2013 | d'Abreu | ................. | G06F 11/10 |
| | | | | 714/763 |
| 8,804,435 B2* | 8/2014 | Matsunaga | ........ | G11C 16/3404 |
| | | | | 365/185.23 |
| 8,891,303 B1* | 11/2014 | Higgins | ................. | G11C 16/10 |
| | | | | 365/185.1 |
| 8,898,540 B1* | 11/2014 | Ilan | ..................... | G06F 11/2053 |
| | | | | 714/6.13 |
| 9,229,813 B2* | 1/2016 | Chatradhi | ........... | G06F 11/1076 |
| 2003/0037299 A1 | 2/2003 | Smith | | |
| 2008/0222490 A1 | 9/2008 | Leung et al. | | |
| 2009/0150748 A1 | 6/2009 | Egner et al. | | |
| 2009/0222701 A1 | 9/2009 | Song et al. | | |
| 2011/0154160 A1 | 6/2011 | Yurzola et al. | | |
| 2016/0070507 A1* | 3/2016 | Hoshikawa | ......... | G06F 12/0246 |
| | | | | 711/149 |

FOREIGN PATENT DOCUMENTS

| | | |
|---|---|---|
| JP | 2008-508632 A | 3/2008 |
| JP | 2010-518523 A | 5/2010 |
| JP | 2011-514595 A | 5/2011 |
| JP | 2013-030072 A | 2/2013 |
| JP | 2013-516000 A | 5/2013 |

* cited by examiner

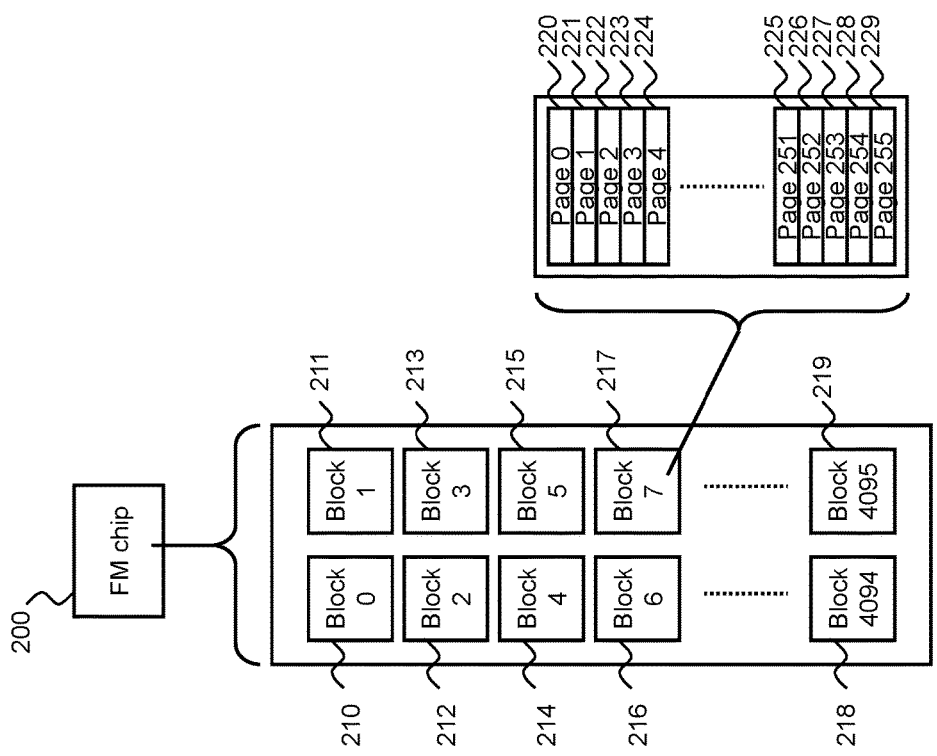

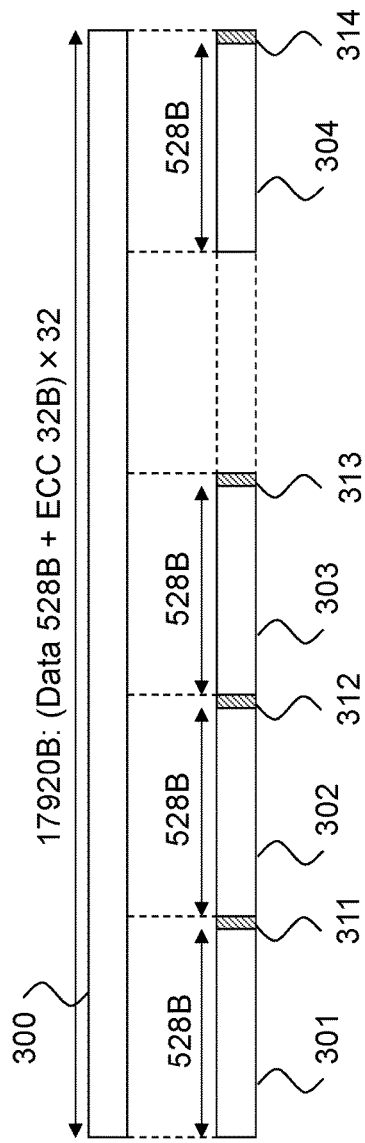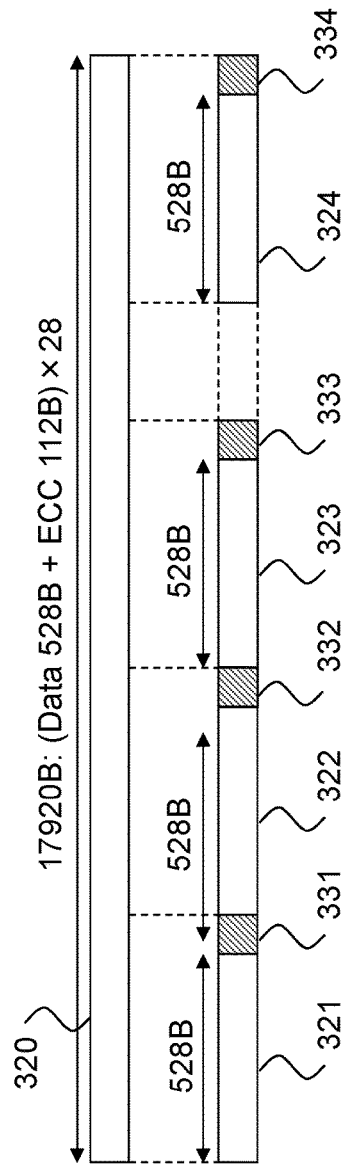

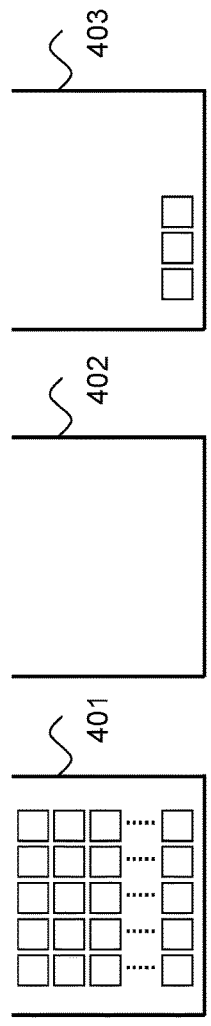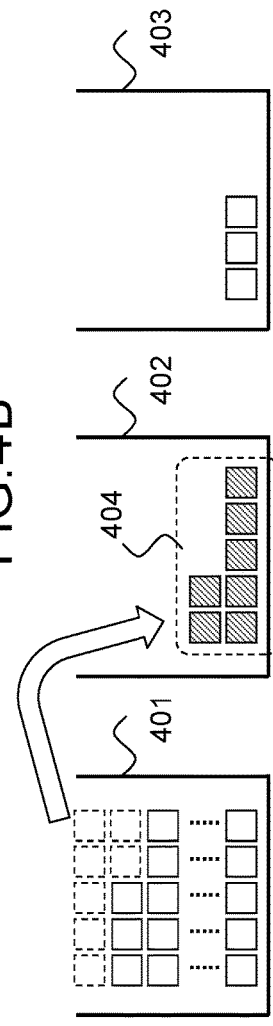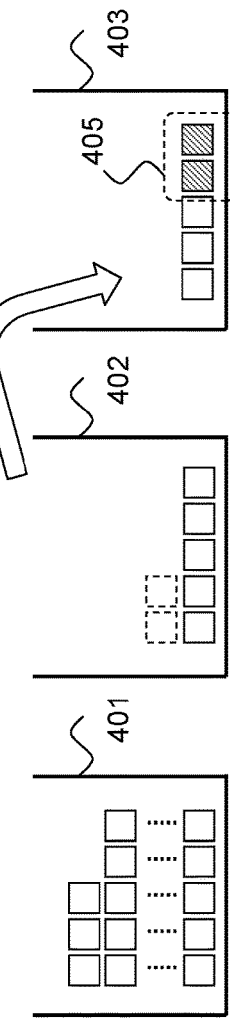

FIG. 7

| Logical page address (710) | Type of pool (720) | Block number (730) | Compre-ssion (740) | Physical page (750) | | |
|---|---|---|---|---|---|---|
| | | | | Address (751) | Offset (752) | Size (753) |
| 00000000 | Standard | 4003 | OFF | 103 | 0 | 32 |
| 00000001 | Reduced | 2215 | ON | 25 | 17 | 11 |
| 00000002 | Reduced | 1032 | ON | 218 | 3 | 10 |
| 00000003 | Standard | 2110 | OFF | 77 | 0 | 32 |
| 00000004 | Standard | 4101 | ON | 165 | 8 | 24 |
| 00000005 | Reduced | 3624 | ON | 49 | 14 | 6 |
| 00000006 | Standard | 2749 | ON | 18 | 11 | 21 |
| 00000007 | Standard | 1867 | OFF | 147 | 0 | 32 |
| ... | ... | ... | ... | ... | ... | ... |

700

MEMORY CONTROLLER AND DATA CONTROL METHOD

CROSS-REFERENCE TO RELATED APPLICATIONS

This application is a U.S. National Stage entry of PCT Application No. PCT/JP2014/076592, filed on Oct. 3, 2014. The contents of the foregoing are incorporated by reference.

TECHNICAL FIELD

The present invention relates to a control method for improving data rewriting durability in a storage apparatus.

BACKGROUND ART

As a data storage medium in a storage apparatus, a randomly accessible non-volatile storage medium, such as a magnetic disc or an optical disc, has been used in the prior art. In particular, a storage apparatus including a lot of small disc drives has recently been used in many cases.

Meanwhile, a non-volatile semiconductor memory capable of batch-erasure has been developed as a result of recent progress of the semiconductor technology, and a storage apparatus using such a non-volatile semiconductor memory as a storage medium has also been developed. Such a non-volatile semiconductor memory may be realized as, for example, a flash memory. A storage apparatus using a flash memory as the storage medium is considered to be more power saving, capable of higher access and the like compared to the storage apparatus including a lot of small disc drives.

The flash memory is not able to directly rewrite data for areas where data has already been recorded. A possible method for realizing rewriting of recorded data, therefore, may be reading and erasing the recorded data in a recorded area, and writing update data in the erased unwritten area. However, as the erasure time is longer than writing time in the flash memory, it is inefficient to execute the erasure every time the data is rewritten.

A typical method that has been adopted to write data, therefore, is a method for first reading old data and combining it with write data to create update data, and writing the created update data in another unwritten area other than the area (original storage area) where the old data is stored, to thereby invalidate the original recorded area. Invalidating the storage area herein indicates processing to prohibit consultation of the storage area by a higher-positioned apparatus. When the unwritten area is gradually consumed and finally depleted, a method for executing the erasure for the area that has been invalidated and creating a new unwritten area is adopted.

Writing to the flash memory needs to be performed for each page. The erasure of the flash memory needs to be performed for each block that includes a plurality of pages. Deterioration of the blocks of the flash memory progresses as a result of repeated erasure, and the possibility of occurrence of bit errors increases. More bit errors occur in the deteriorated blocks as time passes after data has been written. As a relief measure for data breakage caused by the bit errors, a method for adding parity to the write data according to an error correction code (ECC) during data writing while correcting the errors using the parity during data reading may be used.

If, however, the data is left for a long time, such as 6 months, after the data has been written, the number of bit errors is larger than the error correction ability provided by the added parity, and the recorded data becomes unrecoverable. To prevent this, the recorded data is regularly read from all blocks to execute error correction processing, while the degree of deterioration is checked by recording the number of correction bits as an index of deterioration degree. According to the degree of deterioration of the blocks represented by the number of correction bits, the data can be protected before it becomes unrecoverable.

A technique disclosed in PTL 1 can be used herein as a data protecting technique. In the technique disclosed in PTL 1, when the number of correction bits in a page is larger than a first reference value, the recorded data of the page is migrated to another page where the number of correction bits is equal to or smaller than the first value. Further, when the number of correction bits in a page is larger than a second reference value, the use of the page is disabled.

CITATION LIST

Patent Literature

[PTL 1] U.S. Pat. No. 8,069,396

SUMMARY OF INVENTION

Technical Problem

In the data protection technique according to PTL 1, when the number of correction bits in a page is larger than a second reference value, the use of the page is disabled. As the number of disabled pages increases to reach a certain number or more, the lifetime of the storage apparatus itself may expire. It is, therefore, necessary not to increase the number of disabled pages as much as possible to improve the data rewriting durability of the storage apparatus or to increase the lifetime of the storage apparatus. Preferably, therefore, the second reference value used to determine whether the use of the page is disabled according to the number of correction bits may be set as large as possible.

To increase the second reference value, however, the number of bits capable of being corrected by the error correction code needs to be increased. To increase the number of correctable bits, the size of the parity to be added to the data should be increased. Accordingly, the number of sectors capable of being stored in a physical page has to be decreased. As a result, a mismatch occurs in the number of sectors between the logical pages and the physical pages, causing an increase of the number of times the writing is performed to the physical pages, while decreasing the rewriting durability of the storage apparatus.

An object of the present invention, therefore, is to provide a technique for improving data rewriting durability of a storage apparatus.

Solution to Problem

A memory controller according to an embodiment of the present invention is configured to control data writing to a non-volatile memory capable of batch-erasure of data and data reading from the non-volatile memory. The memory controller includes an error check and correction circuit configured to perform a calculation regarding an error correction code of data, and a processor configured to use the error check and correction circuit and write the data with the error correction code to the non-volatile memory when writing the data to the non-volatile memory, while performing error correction of the data using the error correction code when reading the data from the non-volatile memory. The processor is configured to count the number of error bits of data stored in a block that is a unit of batch-erasure of the data. The processor is configured to store the data in the block with a first error correction code when the number of the error bits is not larger than a predetermined reference value, the first error correction code having a predetermined error correction ability of the data. The processor is configured to store the data in the block with a second error correction code when the number of the error bits is larger than the predetermined reference value, the second error correction code having an error correction ability of the data higher than that of the first error correction code.

Advantageous Effects of Invention

According to an embodiment of the present invention, it is possible to use the storage area of the block efficiently, while improving the data rewriting durability of the storage apparatus.

BRIEF DESCRIPTION OF DRAWINGS

FIG. 2 illustrates an internal structure of an FM chip 200 that is a constituent element of a flash memory 105.

FIG. 3A is an explanatory diagram of a data storage layout for pages 220 to 229.

FIG. 3B is an explanatory diagram of a data storage layout for pages 220 to 229.

FIG. 4A is an explanatory diagram of a method for managing blocks by a memory controller 103.

FIG. 4B is an explanatory diagram of the method for managing blocks by the memory controller 103.

FIG. 4C is an explanatory diagram of the method for managing blocks by the memory controller 103.

FIG. 7 illustrates a page map table 700 indicating a correspondence relation between a logical sector address included in a read/write command from an external apparatus and a physical page address in the flash memory 105.

DESCRIPTION OF EMBODIMENTS

Figure 1:
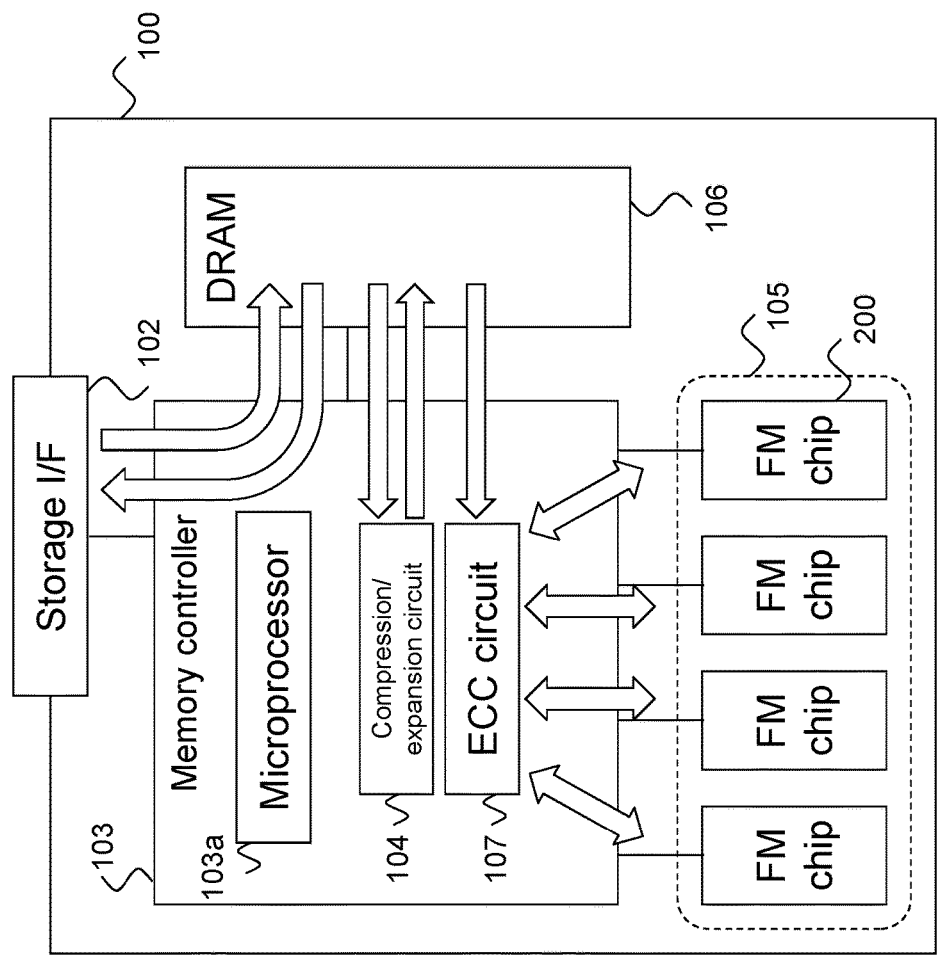
FIG. 1 is a block diagram illustrating a flash memory module 100 according to the present embodiment.

FIG. 1 is a block diagram illustrating a flash memory module 100 according to the present embodiment. Referring to FIG. 1, a flash memory module (hereinafter referred to as FM module) 100 according to the present embodiment will be described.

The FM module 100 includes a storage interface (the interface will be indicated as I/F hereinafter) 102, a memory controller 103, a NAND-type flash memory (hereinafter referred to as FM or flash memory) 105 that is a non-volatile memory including a plurality of chips, and a dynamic random access memory (DRAM) 106 formed as a volatile memory.

The memory controller 103 includes a microprocessor 103a, a compression and expansion circuit 104, and an ECC circuit 107. The memory controller 103 is coupled to the storage I/F 102, the flash memory chip 105, and the DRAM 106, which are controlled by the microprocessor 103a.

The microprocessor 103a interprets content of a read/write command received via the storage I/F 102, transmits and receives read/write data, compresses and expands data by the compression and expansion circuit 104, generates parity and corrects bit errors by the ECC circuit 107, and executes data transfer between the flash memory 105 and the DRAM 106.

The storage I/F 102 is an interface mechanism to be coupled to, for example, an external apparatus. The storage I/F 102 receives user data from the external apparatus according to a write command issued by the external apparatus, or transmits the user data to the external apparatus according to a read command issued by the external apparatus.

The compression and expansion circuit 104 is a computing unit mounted as hardware (logic circuit) in the memory controller 103. The compression and expansion circuit 104 reversibly compresses plaintext data to generate compressed data, to thereby decrease data quantity to be stored in the flash memory 105. The compression and expansion circuit 104 also expands the data in the compressed state to generate the original plaintext data.

The ECC circuit 107 is a computing unit mounted as hardware (logic circuit) in the memory controller 103. The ECC circuit 107 generates parity that is previously added to data to be written in the flash memory 105 such that bit errors in the data, if occurred, can be corrected afterward. The ECC circuit 107 corrects bit errors occurred in the data read from the flash memory 105.

The DRAM 106 temporarily stores write data received from the external apparatus. The DRAM 106 also temporarily stores read data to be transmitted to the external apparatus. The DRAM 106 functions as a write buffer that temporarily stores the data to be written in the flash memory 105 before adding parity to the data in the ECC circuit 107. The DRAM 106 also functions as a read buffer that temporarily stores the data read from the flash memory 105 after correcting errors in the ECC circuit 107. The DRAM 106 also functions as a transfer source of data to be compressed/expanded by the compression and expansion circuit 104, and also functions as a transfer destination of a compression/expansion result.

FIG. 2 illustrates an internal structure of an FM chip 200 that is a constituent element of the flash memory 105. Referring to FIG. 2, the internal structure of the FM chip 200 will be described. The FM chip 200 includes a plurality of blocks 210 to 219. The blocks 210 to 219 are the units of erasing data when the data is erased in a batch. The number of blocks 210 to 219 included in each FM chip 200 may be, for example, 4,096 blocks.

Each of the blocks 210 to 219 (block 217 in the example of FIG. 2) includes a plurality of pages 220 to 229 that are units of writing data. The number of pages included in each of the blocks 210 to 219 may be, for example, 256 pages. These pages are numbered 0 to 255. A single page has a capacity of, for example, 17,920 bytes.

There is a restriction that overwriting of data is prohibited in pages 220 to 229 among 256 pages of each of the blocks 210 to 219 of the FM chip 200, such that the data is written in ascending order for the pages from page 0 toward page 255 among the plurality of pages 220 to 229. Once the writing is performed to the last page of a particular block, no more data writing is allowed in the block. In this case, necessary data is migrated to another empty block before performing batch-erase of the data.

After the erasure, the block becomes writable again from page 0. Because of such restriction of the FM chip 200, the memory controller 103 constantly manages blocks having unwritten pages (empty pages) and, based on which, selects a page that data received from the external apparatus is written to is selected. Thus, a correspondence relation between the logical sector address designated by the write command from the external apparatus and the physical page address to which the write data is actually written changes dynamically. The memory controller 103, therefore, needs to constantly manage the correspondence relation between the logical sector address and the physical page address.

FIGS. 3A and 3B are explanatory diagrams of data storage layouts for pages 220 to 229. Referring to FIGS. 3A and 3B, the layouts of pages 220 to 229 will be described. The data size to be stored is in a sector unit. The size of the sector is, for example, 528B.

FIG. 3A illustrates a layout to store data having a standard number of sectors in the page 300. In this layout, for example, 32 pieces of sector data (301, 302, 303, . . . , 304) are included, with each piece of sector data including a 32-byte ECC parity (311, 312, 313, . . . , 314).

FIG. 3B illustrates is a layout to store data having a reduced number of sectors in the page 320. In this layout, for example, 28 pieces of sector data (321, 322, 323, . . . , 324) are included, with each piece of sector data including a 112-byte ECC parity (331, 332, 333, . . . , 334), which is larger than that of FIG. 3A.

As illustrated in the layout of FIG. 3B, the size of the ECC parity having been added to each sector data is larger than that of the layout of FIG. 3A. Generally, as the size of the ECC parity increases, a larger number of bits can be corrected for bit errors. That is, as the size of the ECC parity increases, an error correction ability of the error correction code becomes higher. However, the number of pieces of data that can be stored in a page would decrease when the size of the ECC parity increases.

While the deterioration of the block has not substantially progressed, data loss of the page of the block can sufficiently be prevented by the error correction ability of the ECC parity with the layout of FIG. 3A. Meanwhile, if the deterioration of the page of the block has progressed by repeatedly rewriting the data, data errors that exceeds the correction ability of the ECC parity may occur and the data may be lost in the layout of FIG. 3A. For the pages of the deteriorated block, therefore, the data is stored according to the layout of FIG. 3B, due to a high error correction ability using the ECC parity, such that the data loss can sufficiently be prevented similar to the case of the block that has not that deteriorated.

The memory controller 103 checks whether each block in the flash memory 105 has been deteriorated, and determines the layout in which the data of the pages of the block should be stored between the layout of the standard number of sectors as illustrated in FIG. 3A and the layout of the reduced number of sectors as illustrated in FIG. 3B. The former layout is selected when the deterioration of the checked block is within a certain criterion, while the latter layout is selected when the deterioration has exceeded the criterion. The deterioration of the block can be determined according to the number of error bits.

If it is determined that the deterioration of the block has exceeded another criterion such that the data loss cannot sufficiently be prevented even with the layout of FIG. 3B, the memory controller 103 regards the block as an inferior block and disables the use of the block.

FIGS. 4A to 4C are explanatory views of a method for managing blocks by the memory controller 103. By referring to FIGS. 4A to 4C, the method for managing the blocks will be described. Three types of block pools 401, 402, and 403 are provided by the memory controller 103 to classify the blocks. All blocks included in the flash memory 105 are always registered in one of the block pools.

The block pool 401 is referred to as a standard block pool where blocks (hereinafter referred to as standard blocks) to which the page layout of FIG. 3A is applied are registered, because the deterioration of the blocks has not progressed.

The block pool 402 is referred to as a reduced block pool where blocks (hereinafter referred to as reduced blocks) to which the page layout of FIG. 3B is applied are registered, because the deterioration of the blocks has progressed to a certain extent.

The block pool 403 is referred to as a disabled block pool where blocks that have been determined as posteriori defective blocks due to further progress of deterioration and blocks referred to as inherently defective blocks having initial failure of impossibility of reading/writing of data from the beginning of use are registered.

FIG. 4A illustrates conditions of the three types of block pools 401, 402, and 403 when the use of the FM module 100 is started. The memory controller 103 registers some of the inherently defective blocks in the disabled block pool 403, but all other blocks are registered in the standard block pool 401.

FIG. 4B illustrates conditions where, after the data has been rewritten to a certain extent using the FM module 100, the memory controller 103 has detected blocks 404 that have exceeded a deterioration criterion of the standard block pool 401, such that those blocks are migrated (registration is changed) to the reduced block pool 402.

FIG. 4C illustrates conditions where, after the data has been further rewritten to a certain extent using the FM module 100, the memory controller 103 has detected blocks 405 that have exceeded the deterioration criterion of the reduced block pool 402, such that those blocks are migrated (registration is changed) to the disabled block pool 403.

Figure 5:
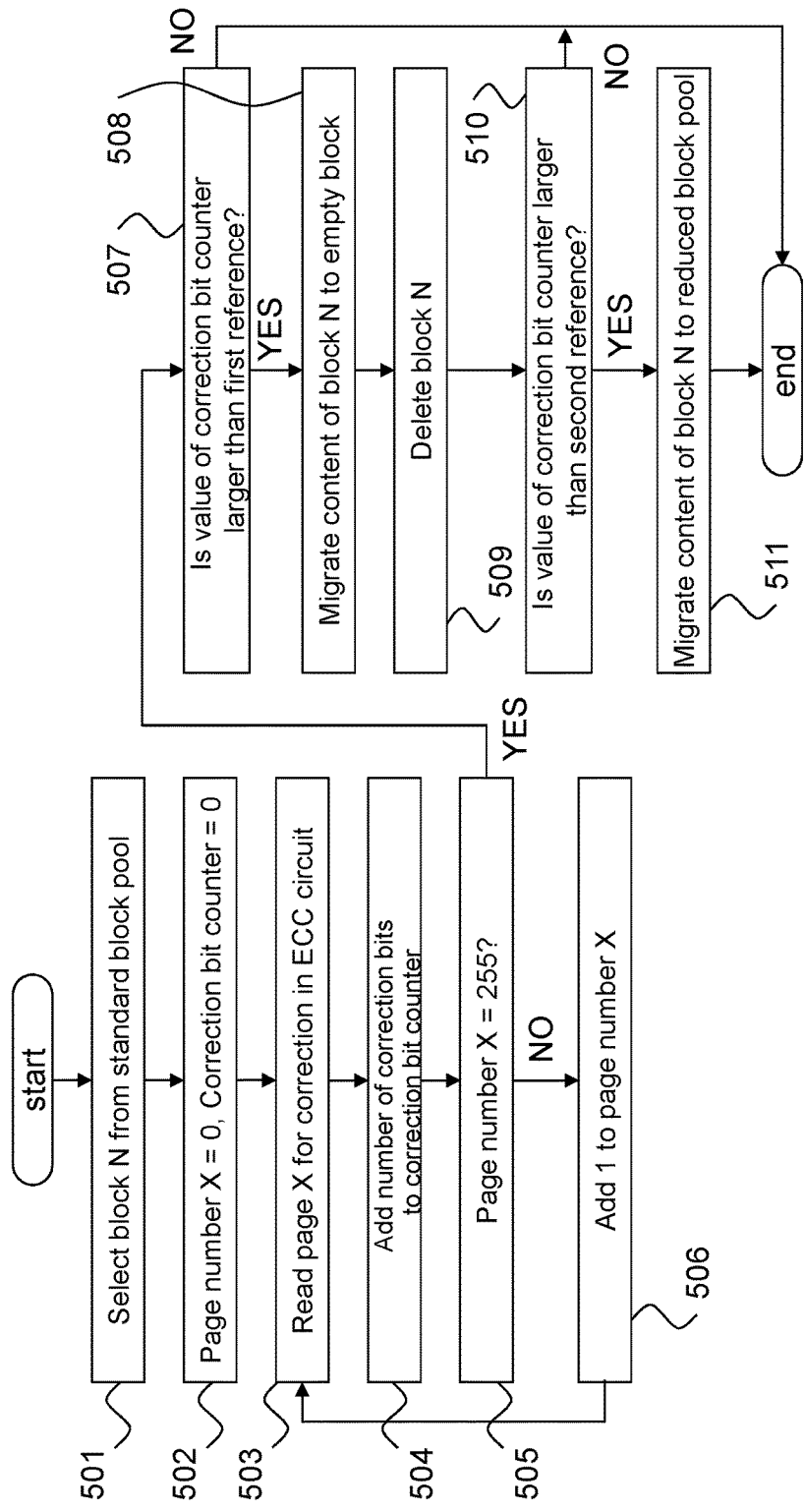
FIG. 5 is a flowchart of data protecting processing for blocks in a standard block pool 401.
Figure 6:
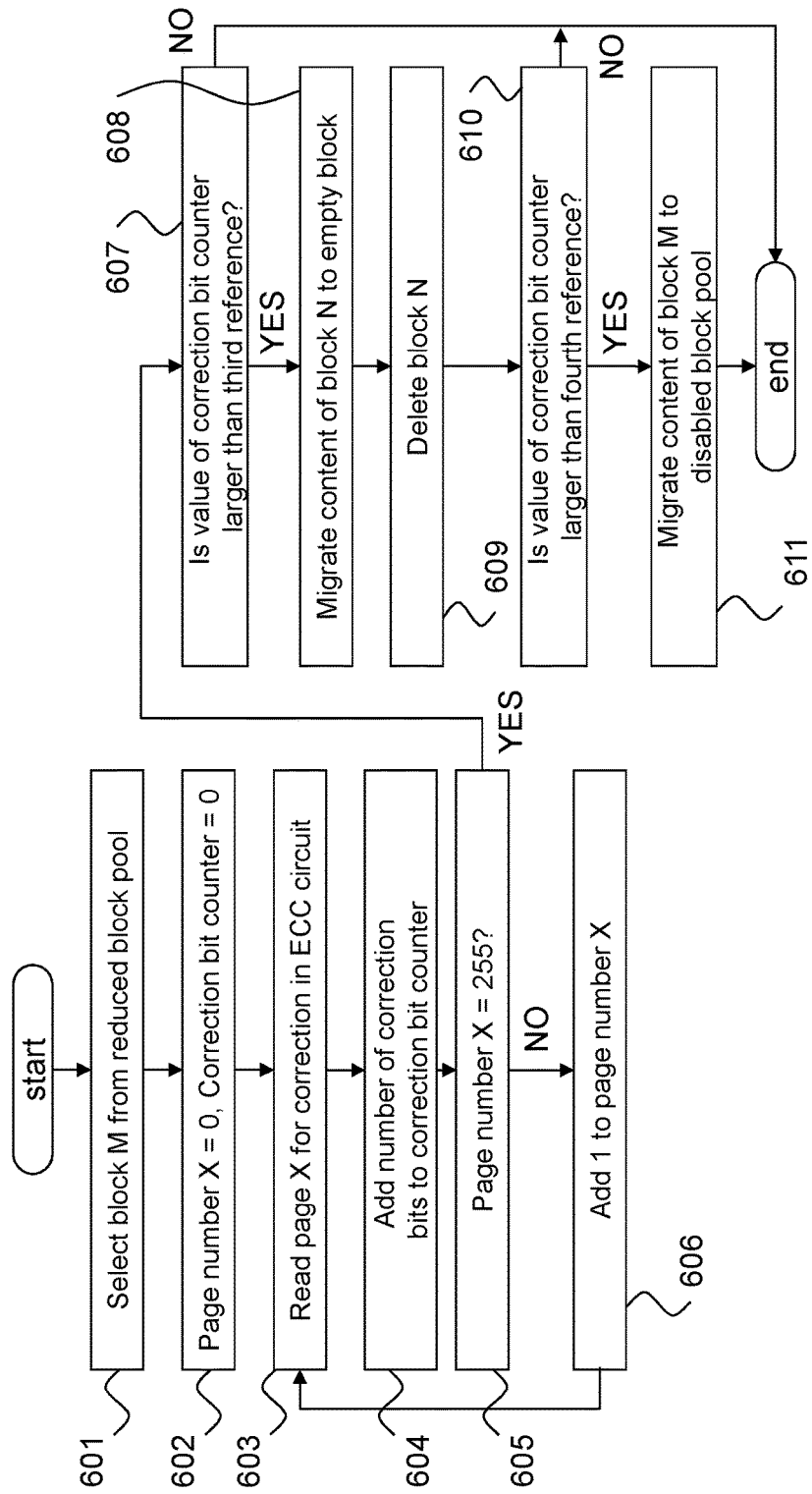
FIG. 6 is a flowchart of data protecting processing for blocks in a reduced block pool 402.

Referring to FIGS. 5 and 6, data protecting processing performed by the memory controller 103 to protect the data stored in the blocks from being lost will be described.

FIG. 5 is a flowchart of data protecting processing for the blocks in the standard block pool 401. The processing performed by the memory controller 103 is executed by the microprocessor 103a. The memory controller 103 regularly performs this processing using, for example, a timer function of the microprocessor 103a.

First, the memory controller 103 selects a physical block N from the standard block pool 401 (step 501). The selected block N is preferably a block that has been left in the standard block pool 401 for the longest time since the last time the selection has been performed in the data protecting processing. Next, the memory controller 103 sets a page number X to 0 and a correction bit counter to 0 (step 502).

The memory controller 103 then reads the physical page X of the block N and passes the contents of the page through the ECC circuit 107 to correct bit errors (step 503). The number of correction bits (the number of error bits) is then added to the correction bit counter (step 504).

If the page number X is 255 indicating the last page (step 505), the process proceeds to step 507. Otherwise, the memory controller 103 adds 1 to the page number X (step 506), and the process returns to step 503. The number of bit errors included in all physical pages in the block N is thus calculated before the process proceeds to step 507, and recorded in the correction bit counter.

In step 507, the memory controller 103 determines whether a value of the correction bit counter is larger than a first reference (e.g., 1024). If not, the memory controller 103 determines that the block N is not so much deteriorated as to require the data protection, and the processing is ended. Meanwhile, if the value is larger than the first reference, the memory controller 103 migrates the block N to another empty block in the standard block pool 401 after correcting the bit errors of the contents of the block N such that accumulated bit errors are removed (step 508). Further, the memory controller 103 deletes the block N (step 509).

Next, the memory controller 103 determines whether the value of the correction bit counter is also larger than a second reference (e.g., 2048) (step 510). If not, the memory controller 103 determines that the degree of deterioration of the block N is at a level low enough to retain the block N in the standard block pool 401, and the data protecting processing is ended. Meanwhile, if the value is larger than the second reference, the memory controller 103 migrates the block N to the reduced block pool 402 (step 511). FIG. 4B illustrates exemplary conditions of the block management when the processing of step 511 has ended.

FIG. 6 is a flowchart of data protecting processing for the blocks in the reduced block pool 402. The memory controller 103 regularly performs this processing using, for example, a timer function of the microprocessor 103a.

First, the memory controller 103 selects a physical block M from the reduced block pool 402 (step 601). The selected block M is preferably a block that has been left in the reduced block pool 402 for the longest time since the last time the selection has been performed in the data protecting processing. Next, the memory controller 103 sets a page number X to 0 and a correction bit counter to 0 (step 602).

The memory controller 103 then reads the physical page X of the block M and passes the contents of the page through the ECC circuit 107 to correct bit errors (step 603). The number of correction bits is then added to the correction bit counter (step 604). If the page number X is 255 indicating the last page (step 605), the process proceeds to step 607 by the memory controller 103. Otherwise, the memory controller 103 adds 1 to the page number X (step 606), and the process returns to step 603. The number of bit errors included in all physical pages in the block M is thus calculated before the process proceeds to step 607, and recorded in the correction bit counter.

In step 607, the memory controller 103 determines whether a value of the correction bit counter is larger than a third reference (e.g., 3072). If not, the memory controller 103 determines that the degree of deterioration of the block M is at a level low enough to perform data protection, and the processing is ended. Meanwhile, if the value has exceeded the third reference, the memory controller 103 migrates the block M to another empty block in the reduced block pool 402 after correcting the bit errors of the contents of the block M such that accumulated bit errors are removed (step 608). Further, the memory controller 103 deletes the block M (step 609).

Next, the memory controller 103 determines whether the value of the correction bit counter is larger than a fourth reference (e.g., 4096) (step 610). If not, the memory controller 103 determines that the degree of deterioration of the block M is at a level low enough to retain the block M in the reduced block pool 402, and the data protecting processing is ended. Meanwhile, if the value is larger than the fourth reference, the memory controller 103 migrates the block M to the disabled block pool 403 (step 611). FIG. 4C illustrates exemplary conditions of the block management when the processing of step 611 has ended.

FIG. 7 illustrates a page map table 700 indicating a correspondence relation between a logical sector address included in a read/write command from an external apparatus and a physical page address in the flash memory 105. Referring to FIG. 7, a method for managing the correspondence relation between the logic sector address included in the read/write command from the external apparatus and the physical page address in the flash memory 105 by the memory controller 103 will be described.

The memory controller 103 sets a page map table 700 on the DRAM 106. In the page map table 700, conditions of physical correspondence are registered for each logical page address 710. The logical page address is an address using 32 sectors as a unit, which is the number of sectors of physical pages of the standard block, and is equivalent to the quotient of the logical sector address divided by 32. For example, the logical page address of a logical sector address 390 is 12. When the read/write command is received from the external apparatus, the logical sector address included in the command is converted into a logical page address. According to the logical page address and the page map table 700, information of the physical page is obtained and, based on the information, the reading/writing of data is performed in the flash memory 105.

Items recited in each row of the page map table 700 will be described. A type of the pool 720 indicates to which block pool the block of the storage destination of the logical page data belongs. The type of the pool is either the standard block pool 401 or the reduced block pool 402. A block number 730 indicates the number of the block storing the logical page data. A compression flag 740 is set to ON when the logical page data is stored in a compressed manner, and set to OFF when the logical page data is stored as it is (as plaintext). A physical page 750 indicates detailed arrangement conditions of the physical page in which the logical page data is stored. Specifically, a physical page address 751 (a value between 0 and 255), an offset 752 for each sector representing a start position of storage in the page, and a storage sector size 753 of the page, are provided.

The FM module 100 has a data compression function, as described above, and the data of, for example, 32 sectors of the logical page may be reduced to data of 1 to 31 sectors before being stored in the physical page. Since the FM module 100 handles the reduced blocks each having 28 sectors to be stored in the page, in addition to the standard blocks each having 32 sectors, the data has to be stored over 2 pages when the logical page data of 29 sectors or more is stored in the reduced block. According to these conditions, the memory controller 103 registers the offset 752 and the size 753 in the page map table 700 in addition to the storage destination physical page 751. If the value of the size 753 is larger than the number of sectors from the value of the offset 752 to the end of the physical page, it is indicated that the logical page data is stored over 2 pages toward the physical page of the next page number.

To store the logical page data over two physical pages, the FM chip 200 has to be written twice to write data equivalent to one logical page according to the write command. The FM chip 200 has to be read twice to read data equivalent to one logical page according to the read command. In this case, a problem of decreasing input and output (IO) performance of the FM module 100 may arise. The FM module 100 of the present embodiment, therefore, performs the following optimization to decrease the possibility of spreading the logical page data over two physical pages.

Figure 8:
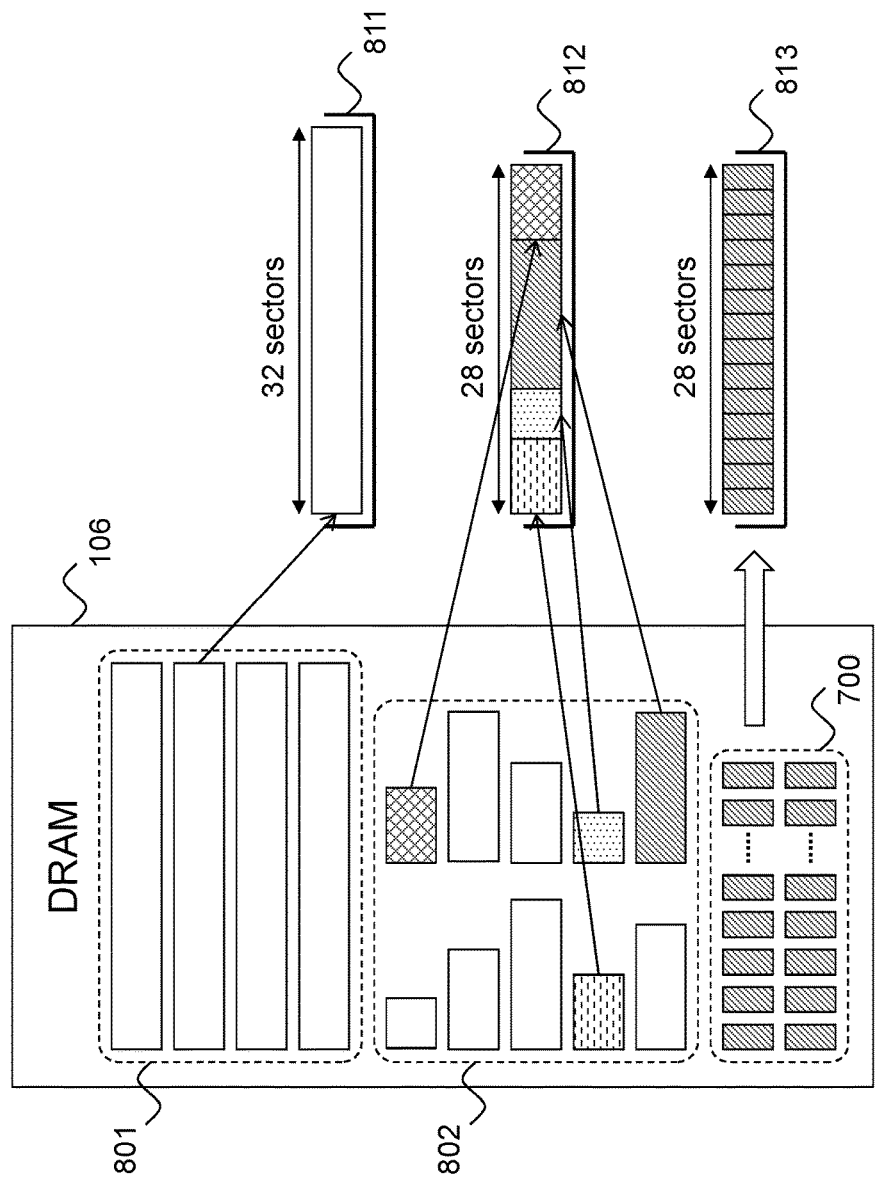
FIG. 8 is an explanatory diagram of optimization of a page map.
Figure 9:
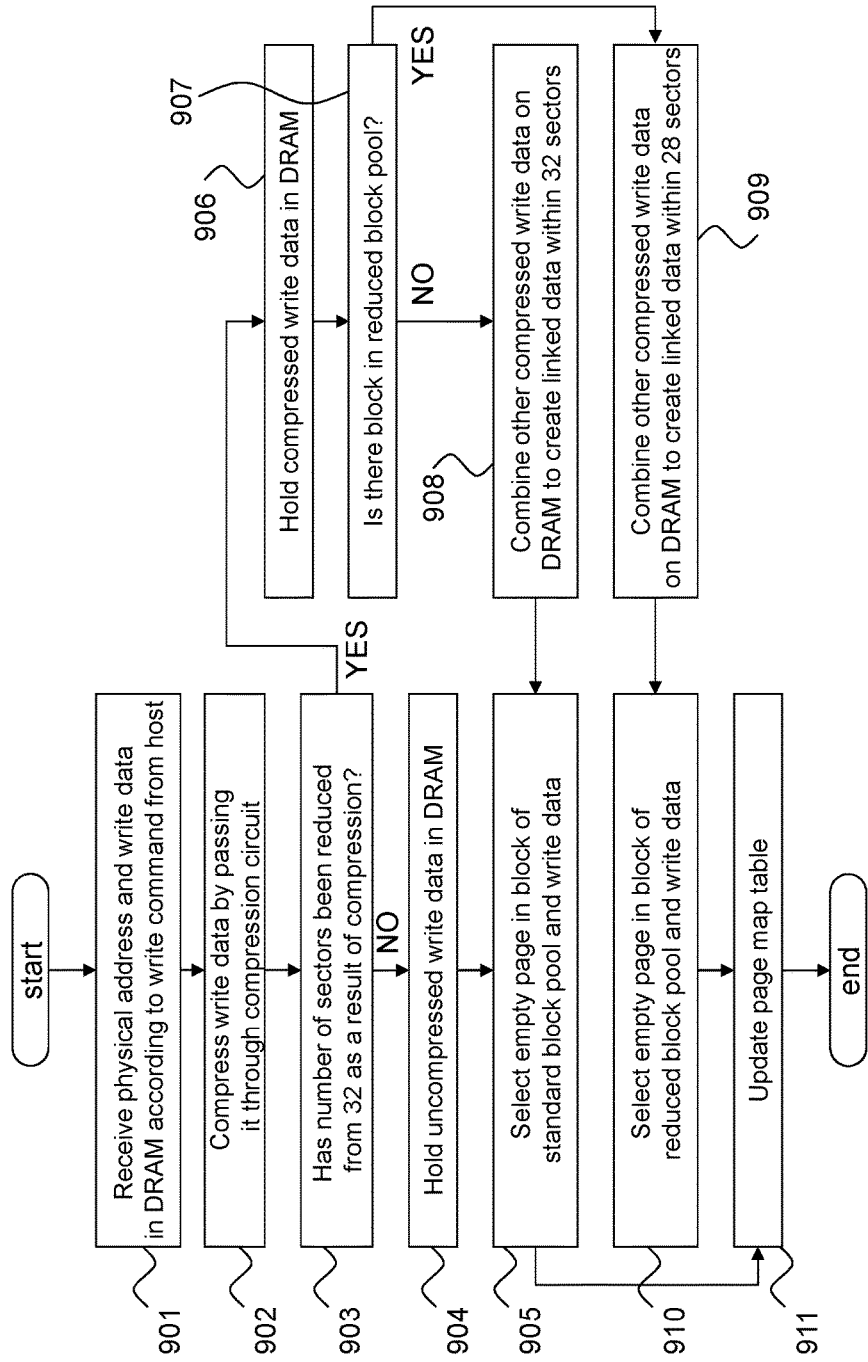
FIG. 9 is an explanatory diagram of optimization of the page map.
Figure 10:
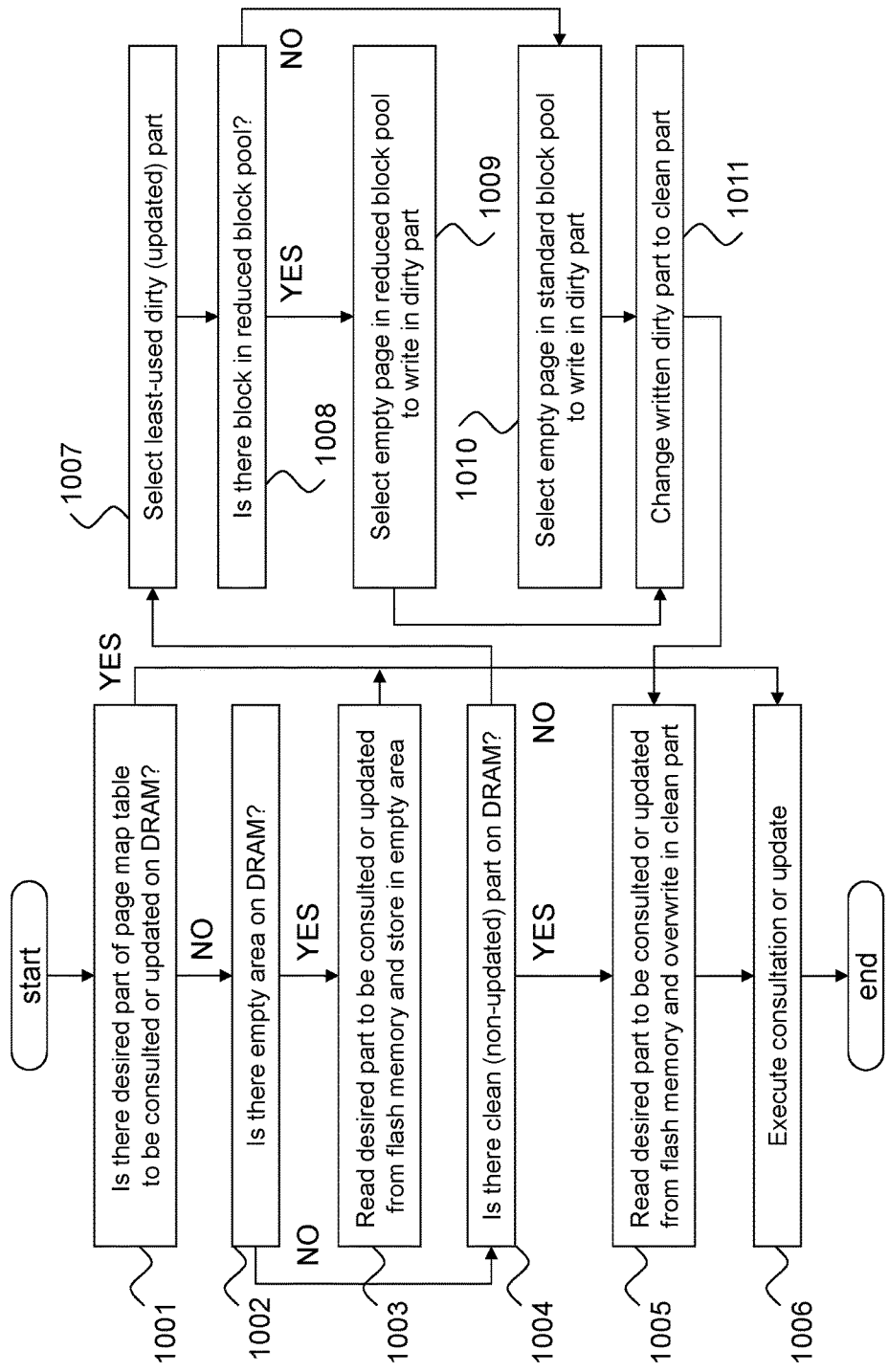
FIG. 10 is an explanatory view of optimization of the page map.

FIGS. 8 to 10 are explanatory diagrams of optimization of a page map. Referring to FIGS. 8 to 10, the optimization of the page map will be described.

FIG. 8 illustrates conditions where more than one piece of logical page data 801, 802 is temporarily held on the DRAM 106 before the data is written in the flash memory 105. An uncompressed logical page data group 801 is an uncompressed plaintext logical page data group of the size of 32 sectors, because the data has not been compressed to or smaller than 31 sectors by the data compressing function. A compressed logical page data group 802 is a logical page data group that has been compressed to 1 to 31 sectors by the data compression function.

The size of all page data included in the uncompressed logical page data group 801 is 32 sectors equivalent to the capacity 811 of the physical page of the standard block, and it is efficient to store the data in the physical page of the standard block. Various sizes of the page data from 1 to 31 sectors are provided in the compressed logical page data group 802, and it is possible to combine some of the page data to form data having the size matching the capacity of the physical page. For example, if the total sectors become 32 sectors, it is efficient to store the data in the physical page of the standard block. If the total sectors become 28 sectors equivalent to the capacity of the physical page 812 of the reduced block, it is efficient to store the data in the physical page of the reduced block.

As described above, it is preferable to allocate with a higher possibility the physical page of the standard block as the storage destination of the page data included in the uncompressed logical page data group 801. The memory controller 103, therefore, may allocate with priority the physical page of the reduced block as the storage destination of the page data included in the compressed logical page data group 802. This is more efficient, as the possibility of allocating the physical page of the standard block is increased as the storage destination of the page data included in the uncompressed logical page data group 801.

FIG. 8 also illustrates conditions where all or part of the page map table 700 used for data management by the memory controller 103 is held on the DRAM 106. The size of the page map table 700 increases according to the number of logical pages. When the capacity of the flash memory 105 mounted on the FM module 100 is large, the entire page map table 700 may not fit the capacity of the DRAM 106. The memory controller 103, therefore, may take a measure to divide the page map table 700 into a plurality of portions in units of 2 sectors, such that only necessary portions are put on the DRAM 106 while the rest portions are saved in the flash memory 105.

As the minimum size of the divided page map table 700 is 2 sectors, 16 or 14 portions may be combined to create linked data to fit the capacity of the physical page. When 16 portions are combined, it would be efficient to store them in the physical page of the standard block. When 14 portions are combined, it would be efficient to store them in the physical page of the reduced block, as the capacity thereof is the same as the capacity 813 of the physical page of the reduced block.

As described above, it is preferable to allocate with a higher possibility the physical page of the standard block as the storage destination of the page data included in the uncompressed logical page data group 801. The memory controller 103, therefore, may allocate with priority the physical page of the reduced block as the storage destination of the divided portions of the page map table 700. This is more efficient, as the possibility of allocating the physical page of the standard block is increased as the storage destination of the page data included in the uncompressed logical page data group 801.

Next, referring to FIG. 9, procedures of processing a write command from the host by the memory controller 103 of the present embodiment will be described.

First, the memory controller 103 receives on the DRAM a write destination logical address and write data according to a write command from the host (step 901). The write data is compressed by passing it through the compression and expansion circuit 104 (step 902). It is determined whether the number of sectors is decreased as a result of the compression (step 903). If the number of sectors has not been decreased, the memory controller 103 holds the data in an uncompressed manner (uncompressed write data) on the DRAM (step 904). The memory controller 103 then selects an empty page of the block in the standard block pool to write the uncompressed data there (step 905). Finally, the memory controller 103 updates in the page map table 700 the storage destination information (the type of pool 720, the block number 730, the compression flag 740, and the physical page 750) of the data of the logical page address corresponding to the write destination logical address (step 911).

Meanwhile, if the number of sectors has been decreased in step 903, the memory controller 103 holds the data in a compressed manner (compressed write data) on the DRAM (step 906). The memory controller 103 then checks if there is a registered block in the reduced block pool (step 907). If there is a registered block, the memory controller 103 combines other compressed write data on the DRAM to create linked data within 28 sectors (step 909). The memory controller 103 then selects an empty page of the block in the reduced block pool to write the compressed data there (step 910). Finally, the memory controller 103 updates in the page map table 700 the storage destination information (the type of pool 720, the block number 730, the compression flag 740, and the physical page 750) of the data of the logical page address corresponding to the write destination logical address (step 911).

Meanwhile, if there is no registered block in step 907, the memory controller 103 combines other compressed data on the DRAM to create linked data within 32 sectors (step 908). The memory controller 103 then selects an empty page of the block in the standard block pool to write the compressed data there (step 905). Finally, the memory controller 103 updates in the page map table 700 the storage destination information (the type of pool 720, the block number 730, the compression flag 740, and the physical page 750) of the data of the logical page address corresponding to the write destination logical address (step 911).

Next, referring to FIG. 10, consultation and update procedures of the page map table 700 by the memory controller 103 of the present embodiment will be described.

First, the memory controller 103 checks in the page map table 700 if there is a desired part to be consulted or updated on the DRAM 106 (step 1001). If there is the desired part to be consulted or updated on the DRAM 106, the memory controller 103 executes consultation or update, and the processing is ended (step 1006). Meanwhile, if there is no desired part to be consulted or updated on the DRAM 106, the memory controller 103 checks if there is an empty area on the DRAM 106 (step 1002).

If there is the empty area on the DRAM 106, the memory controller 103 reads the desired part to be consulted or updated from the flash memory 105 and stores it in the empty area (step 1003). Finally, the memory controller 103 executes consultation or update, and the processing is ended (step 1006).

Meanwhile, if there is no empty area on the DRAM 106 in step 1002, the memory controller 103 checks if there is a clean (non-updated) part in the page map table 700 loaded on the DRAM 106 (step 1004). If such part exists, the memory controller 103 reads the desired part to be consulted or updated from the flash memory 105 and overwrites such part in the clean part (step 1005), as deleting such part from the DRAM 106 would not be a problem because the flash memory 105 includes a backup of such part. Finally, the memory controller 103 executes consultation or update, and the processing is ended (step 1006).

If there is no clean (non-updated) part in step 1004, the memory controller 103 selects some of dirty (updated) parts that have been least used in the page map table 700 on the DRAM 106 (step 1007). Since the flash memory 105 does not include a backup of the dirty parts, the dirty parts have to be written back to the flash memory 105 before deleted from the DRAM 106.

The memory controller 103 then checks if there is a registered block in the reduced block pool (step 1008). If there is a registered block, the memory controller 103 selects an empty page of the block in the reduced block pool, and combines 14 dirty parts to write them there (step 1009). The process then proceeds to step 1011.

Meanwhile, if there is no registered block in step 1008, the memory controller 103 selects an empty page of the block in the standard block pool, and combines 16 dirty parts to write them there (step 1010). The process then proceeds to step 1011.

In step 1011, the memory controller 103 changes the status of the written dirty parts to clean to allow such parts to be deleted from the DRAM 106. The memory controller 103 reads the parts to be consulted or updated from the flash memory 105 and overwrites the parts in the clean parts (step 1005). Finally, the memory controller 103 executes consultation or update, and the processing is ended (step 1006).

According to the consultation and update procedures described above, the possibility of spreading the logical page data over two physical pages is decreased, while the decrease of the I/O performance of the FM module 100 is restricted.

Figure 11:
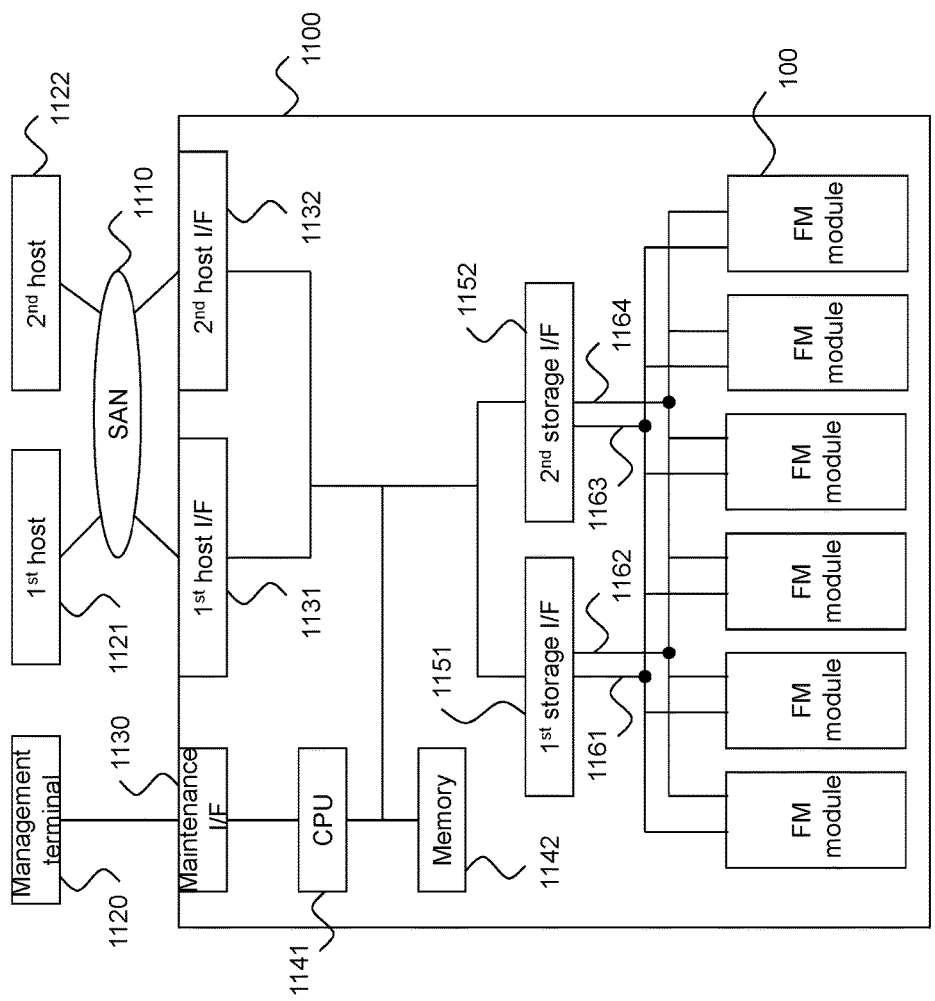
FIG. 11 is a block diagram illustrating a computer system to which the FM module 100 of the present embodiment is applied.

FIG. 11 is a block diagram illustrating a computer system to which the FM module 100 of the present embodiment is applied. Referring to FIG. 11, the structure of the computer system will be described.

The computer system includes a storage apparatus 1100, first and second hosts 1121, 1122, a management terminal 1120, and a storage area network (SAN) 1110. The first and second hosts 1121, 1122 will simply be referred to as hosts hereinafter.

The storage apparatus 1100 interprets a command transmitted from the host and executes reading/writing of data within a storage area of the storage apparatus 1100. The storage apparatus 1100 includes first and second host I/Fs 1131, 1132, first and second storage I/Fs 1151, 1152, a maintenance I/F 1130, a central processing unit (CPU) 1141, a memory 1142, connectors 1161, 1162, 1163, 1164, and a flash memory module 100, and so on.

The first and second host I/Fs 1131, 1132 will simply be referred to as host I/Fs hereinafter. The first and second storage I/Fs 1151, 1152 will simply be referred to as storage I/Fs hereinafter. The maintenance I/F 1130, the CPU 1141, the memory 1142, the connectors 1161, 1162, 1163, 1164 will simply be referred to as connectors. The flash memory module 100 will be referred to as FM module.

The host I/Fs are interfaces that receive data, control commands and the like from the hosts. The storage I/Fs are interfaces that transmit data, control commands and the like to the FM modules 100. The maintenance I/F 1130 is an interface coupled to the management terminal 1120 to receive control commands and the like from the management terminal 1120 regarding management and maintenance.

The CPU 1141 functions as an arithmetic processing unit and controls the entire operation of the storage apparatus 1100 according to various programs, arithmetic parameters and the like stored in the memory 1142. Specifically, the CPU 1141 processes input/output of user data (data I/O) between the storage apparatus 1100 and the hosts, issues to the FM modules 100 a write command to write user data to the FM modules 100, or issues to the FM modules 100 a read command to read user data from the FM modules 100. The CPU 1141 generates a guarantee code to the user data received from the hosts and supplies it to the user data. The guarantee code will be described in detail below.

In addition to various programs, arithmetic parameters and the like, the memory 1142 temporarily stores control information, management information, the user data to be written to the FM modules 100, and the user data having been read from the FM modules 100.

In the illustrated example of FIG. 11, six FM modules 100 are provided, but the number of the FM modules 100 is not limited to this example. The FM modules 100 are coupled to the storage I/Fs via the connectors, such that the data and control commands received from the hosts are written to the FM modules 100 via the connectors. In the present embodiment, the FM modules 100 are illustrated in an integrated manner with the storage apparatus 1100, but it is not limited thereto and the FM modules 100 may be provided separately from the storage apparatus 1100.

The hosts are coupled to the storage apparatus 1100 via the SAN to transmit read/write requests of data to the storage apparatus 1100. The hosts are computer apparatuses including an information processing resource, such as a CPU, a memory, and are formed as, for example, a personal computer, a workstation, or a main frame. Communications between the hosts and the storage apparatus 1100 is performed by using block protocol, such as small computer system interface (SCSI). The hosts include information input apparatuses, such as a keyboard, a switch, a pointing device, and a microphone, and information output apparatuses, such as a monitor display and a speaker.

The management terminal 1120 is a computer apparatus including an information processing resource, such as a CPU, a memory, and is formed as, for example a personal computer, a workstation, or a main frame. The CPU functions as an arithmetic processing unit and controls the operation of the management terminal 1120 according to various programs, arithmetic parameters and the like stored in the memory. The management terminal 1120 is an apparatus which includes information input apparatuses, such as a keyboard, a switch, a pointing device, and a microphone, and information output apparatuses, such as a monitor display, and a speaker, and manages the storage apparatus 1100 and the like according to the input from an operator or the like.

In FIG. 11, two connectors each are illustrated for the hosts and the FM modules 100, but the number of connectors is not limited to this example so long as at least one connector is provided. Similarly, the standards applied to the connectors and interfaces are not specifically limited. For example, typical standards to be applied to the SAN 1110 may include fibre channel (FC), SCSI, Internet small computer system interface (iSCSI), and serial attached SCSI (SAS).

The storage apparatus 1100 has a capacity virtualization function as a function to decrease the storage capacity. The capacity virtualization function is a function to show to the hosts 1121, 1122 a virtual capacity of the storage apparatus 1100 larger than the physical capacity thereof. The function is realized by the CPU 1141 of the storage apparatus 1100. This is realized using a feature that, when the user uses the storage apparatus 1100 in practice, the user defines a user volume capacity, or a logical volume capacity seen from the user. When the user actually stores data, the data quantity might hardly reach the storage capacity of the user volume, or the capacity defined by the user.

In the storage apparatus having no capacity virtualization function, the physical capacity is secured when the volume is defined. However, the physical capacity is not secured until data is actually stored in the storage apparatus 1100 in the storage apparatus having the capacity virtualization function. Accordingly, the storage capacity consumed, or the storage capacity secured, in the storage apparatus 1100 can be decreased, while eliminating the need for the user to strictly define the capacity of the user volume. For example, the user may simply define the capacity with margin to improve usability. To realize the capacity virtualization function, the CPU 1141 needs to grasp the virtual capacity of the FM modules 100.

Since the FM modules 100 have the data compression function, the virtual capacity can be increased by compressing the data. The CPU 1141 may estimate a compression ratio of the user data to be, for example, 50%, and grasp the virtual capacity of the FM modules 100 to be twice as large as the physical capacity of the FM modules 100.

In this case, if the compression is not as effective as expected and the actual compression ratio is worse than 50%, an event that no more data can be stored in the FM modules 100 even though the capacity of data stored in the FM modules 100 is smaller than the virtual capacity grasped by the CPU 1141 may occur.

Meanwhile, the compression is more effective than expected and the actual compression ratio is better than 50%, an event that a large capacity is still left even after the data capacity substantially equal to the virtual capacity grasped by the CPU 1141 has been stored in the FM modules 100 may occur. The occurrence of such events may be prevented by dynamically changing the virtual capacity grasped by the CPU 1141. The FM modules 100 of the present embodiment, therefore, have a feature to notify the external apparatus (CPU 1141) of information of the compression ratio via a special command. With this feature, a more efficient capacity virtualization function can be realized in the storage apparatus 1100.

As described above, however, to improve the rewriting durability, the FM modules 100 of the present embodiment has the function of expanding the size of the error correction code for the blocks where the deterioration has progressed and decreasing the number of sectors to be stored in the physical page, to thereby continue the use of the block. Decreasing the number of sectors to be stored in the physical page may deteriorate a substantial data compression ratio of the FM modules 100.

For example, even when the user data of 32 sectors is compressed to 28 sectors and the compressed data is recorded on the physical page of the reduced block, the capacity equivalent to the compressed portion of the data would be offset by the expansion of the error correction code, and the capacity necessary for data storage becomes equivalent to the case when the data is not compressed. The FM modules 100 of the present embodiment, therefore, have a feature of adjusting the information of the compression ratio, which is notified to the external apparatus, to be worse, or to have no effect of compression, depending on the number of registered blocks in the reduced block pool. As a result, the occurrence of the event that, in the capacity virtualization function, the data is not able to be stored in the FM modules 100 when the number of registered blocks is increased in the reduced block pool can be restricted.

As described above, in the present embodiment, the memory controller 103, which controls writing and reading of data to and from the flash memory 105 provided as a non-volatile memory capable of batch-erasure of data, includes the error check and correction circuit (ECC circuit) 107 and the microprocessor 103a. The ECC circuit 107 performs calculations regarding the error correction code of data. The microprocessor 103a uses the ECC circuit 107 to write data with the error correction code when writing the data to the flash memory 105, and performs error correction of the data using the error correction code when reading the data from the flash memory 105. The microprocessor 103a counts the number of error bits of the data stored in the block that is a unit of batch-erasure of data. If the number of error bits is not larger than the predetermined reference value, the microprocessor 103a stores in the block the data with the first error correction code including the predetermined error correction ability of data. Meanwhile, if the number of error bits is larger than the reference value, the microprocessor 103a stores in the block the data with the second error correction code having a higher error correction ability than the first error correction code. Thus, the data is stored with the error correction code having a lower error correction ability but requiring only a small number of bits added to the data in the block where the deterioration has not progressed, while the data is stored with the error correction code having a higher error correction ability but requiring a large number of bits in the block where the deterioration has progressed. Therefore, the storage area of the block can be used efficiently according to the degree of deterioration, while improving the data rewriting durability of the storage apparatus.

In the present embodiment, the microprocessor 103a previously sets the first block pool (standard block pool) and the second block pool (reduced block pool). The first block pool includes the blocks that store the data with the first error correction code added. The second block pool includes the blocks that store the data with the second error correction code added. The microprocessor 103a adds the first error correction code to the data, stores the data in the block included in the first block pool, performs error correction of the data stored in the block included in the first block pool, and counts the number of error bits in the block. If the number of error bits of the block is larger than the first reference value, the microprocessor 103a migrates the data stored in the block to another block included in the first or second block pool, and performs batch-erasure of the block.

Meanwhile, if the number of error bits of the block is larger than the second reference value of the block even higher than the first reference value, the microprocessor 103a changes the block pool to which the block belongs to the second block pool. Thus, the blocks are managed for each block pool according to the number of error bits, such that the error correction ability of the error bit codes, which are selected based on the degree of deterioration of the block for the plurality of blocks, can be easily set.

In the present embodiment, the microprocessor 103a counts the number of error bits of the data stored in the block where the data is stored with the second error correction code. If the number of the error bits is larger than the predetermined another reference value higher than the reference value mentioned above, the data is not stored in the block. Thus, the use of the block is not disabled until the deterioration has progressed to such an extent that the correction is not sufficiently performed even with the error correction code having a high error correction ability, such that the storage area of the block can be used efficiently according to the degree of deterioration of the block, while improving the rewriting durability of data of the storage apparatus.

In the present embodiment, the microprocessor 103a also previously sets the third block pool that includes the blocks where the data storage has been prohibited, adds the second error correction code to the data, and stores the data in the block that belongs to the second block pool. The microprocessor 103a then performs error correction of the data stored in the block that belongs to the second block pool and counts the number of error bits in the block. If the number of the error bits of the block is larger than the third reference value higher than the second reference value, the data stored in the block is migrated to another block that belongs to the first block pool or the second block pool. If the number of the error bits of the block is larger than the fourth reference value even higher than the third reference value, the microprocessor 103a changes the block pool of the block to the third block pool. Thus, the management of the block pools is performed using the block pools such that the use of the block is disabled when the deterioration has progressed to such an extent that the correction is not sufficiently performed even with the error correction code having high error correction ability. Therefore, the management of the plurality of blocks can be performed easily according to the degree of deterioration of the blocks.

The present embodiment further includes the compression and expansion circuit 104 that compresses data at least partly among the data to be written in the flash memory 105, and expands the data stored in a compressed manner in the flash memory 105 when reading the data. The microprocessor 103a stores with priority the uncompressed data in the block where the data is stored with the first error correction code, and stores with priority the compressed data in the block where the data is stored with the second error correction code. Thus, the data including the decreased number of bits due to the compression is stored with priority in the block that stores the data with the second error correction code having a larger bits than the first error correction code, such that the decrease of the data quantity capable of being stored in one block can be restricted.

In the present embodiment, the block includes a plurality of physical pages of a fixed size, and the microprocessor 103a manages the correspondence relation between the physical pages and the logical pages of variable sizes for at least the block to which the data with the second error correction code added is written. Regarding the block to which the data with the second error correction code added is written, the variable-sized data in which the data size may be increased due to the error correction code or decreased due to the compression is stored, but the storage of data can be facilitated by managing the correspondence relation between the variable-seized logical pages and the fixed-sized physical pages.

In the present embodiment, the microprocessor 103a temporarily records the compressed data in the random access memory (DRAM) 106 before storing the data in the flash memory 105. More than one piece of compressed data recorded in the DRAM 106 is combined to create linked data of a size matching the physical page of the block that stores the data with the second error correction code added thereto. The microprocessor 103a writes the linked data to the physical page of the block to which the data with the second error correction code added thereto is stored. Thus, more than one piece of the compressed data is thus combined and written as linked data matching the physical page of the block having reinforced error correction ability, the compressed data can be mounted efficiently on the physical page.

In the present embodiment, the microprocessor 103a also calculates the compression ratio of data by adjusting the increase of the data quantity due to the addition of the second error correction code, when the compressed data is stored in the block where the data is stored with the second error correction code. Thus, the compression ratio of the data can be calculated by considering the increase of the data quantity due to the addition of the second error correction code and the decrease of the data quantity due to the compression, such that the actual compression ratio of the data can be known.

The present embodiment described above is merely an example for explaining the present invention, and the scope of the present invention is not intended to be limited only to the above embodiment. A person skilled in the art would implement the present invention in various other manners without departing from the concept of the present invention.

REFERENCE SIGNS LIST

100 Flash memory module
103 Memory controller
103a Microprocessor
104 Compression and expansion circuit
105 Flash memory chip
106 DRAM
107 ECC circuit
1100 Storage apparatus
1110 SAN
1120 Management terminal
1121 Host
1141 CPU
1142 Memory
1161 Connector
200 Flash memory chip
401 Standard block pool
402 Reduced block pool
403 Disabled block pool
404 Block
405 Block
801 Uncompressed logical page data group
802 Compressed logical page data group

The invention claimed is:

1. A memory controller configured to control data writing to a non-volatile memory capable of batch-erasure of data and data reading from the non-volatile memory, comprising:

an error check and correction circuit configured to perform a calculation regarding an error correction code of data; and a processor configured to use the error check and correction circuit and write the data with the error correction code to the non-volatile memory when writing the data to the non-volatile memory, while performing error correction of the data using the error correction code when reading the data from the non-volatile memory, the processor being configured to count the number of error bits of data stored in a block that is a unit of batch-erasure of the data, the processor being configured to store the data in the block with a first error correction code when the number of the error bits is not larger than a predetermined reference value, the first error correction code having a predetermined error correction ability of the data, and the processor being configured to store the data in the block with a second error correction code when the number of the error bits is larger than the predetermined reference value, the second error correction code having an error correction ability of the data higher than that of the first error correction code;

wherein:

the processor is configured to set a first block pool and a second block pool as block pools to which blocks belong, the first block pool including a block that stores data with the first error correction code added, and the second block pool including a block that stores data with the second error correction code added, the processor is configured to add the first error correction code to the data and stores the data in the block that belongs to the first block pool, the processor is configured to perform error correction of the data stored in the block that belongs to the first block pool and count the number of error bits in the block, the processor is configured to migrate the data stored in the block to another block that belongs to the first block pool or the second block pool and perform batch-erasure of the block when the number of the error bits of the block is larger than a first reference value, and the processor is configured to change the block pool to which the block belongs to the second block pool when the number of the error bits of the block is larger than a second reference value higher the first reference value.

2. The memory controller according to claim 1, wherein the processor is configured to count the number of the error bits of the data stored in the block where the data is stored with the second error correction code, and the processor is configured not to store the data in the block when the number of the error bits is larger than another predetermined reference value higher than the reference value.

3. The memory controller according to claim 1, wherein the processor is configured to further set a third block pool to which a block disabled for data storage belongs, the processor is configured to add the second error correction code to the data and store the data in the block that belongs to the second block pool, the processor is configured to perform error correction of the data stored in the block that belongs to the second block pool and count the number of the error bits of the block, the processor is configured to migrate the data stored in the block to another block that belongs to the first block pool or the second block pool when the number of the error bits of the block is larger than a third reference value higher than the second reference value, and the processor is configured to change the block pool to which the block belongs to the third block pool when the number of the error bits of the block is larger than a fourth reference value higher than the third block pool.

4. The memory controller according to claim 1, further comprising:

a compression and expansion circuit configured to compress at least part of data to be written in the non-volatile memory, and expand the data when reading the data stored in the non-volatile memory in a compressed manner, wherein the processor is configured to store with priority uncompressed data in the block where the data is stored with the first error correction data, while storing with priority the compressed data in the block where the data is stored with the second error correction code.

5. The memory controller according to claim 4, wherein the block includes a plurality of physical pages of a fixed size, and the processor is configured to at least manage a correspondence relation between a variable-sized logical page and the physical pages regarding the block where the data with the second error code added is written.

6. The memory controller according to claim 5, wherein the processor is configured to temporarily store more than one piece of the compressed data in a random access memory before writing the compressed data to the non-volatile memory, and the processor is configured to combine a lot of compressed data recorded in the random access memory to create linked data of a size matching the physical page of the block where the data with the second error correction code added is stored, and write the linked data to the physical page of the block where the data is added with the second error correction code.

7. The memory controller according to claim 4, wherein the processor is configured to calculate a compression ratio of the data after adjusting an increase of data quantity caused by the addition of the second error correction code when the compressed data is stored in the block where the data is stored with the second error correction code.

8. A data control method performed by a memory controller configured to control data writing to a non-volatile memory capable of batch-erasure of data and data reading from the non-volatile memory, the memory controller including an error check and correction circuit configured to perform a calculation regarding an error correction code of data, and a processor configured to use the error check and correction circuit, and write the data with the error correction code to the non-volatile memory when writing the data to the non-volatile memory, while performing error correction of the data using the error correction code when reading the data from the non-volatile memory, the data control method comprising:

counting the number of error bits of data stored in a block that is a unit of batch-erasure of the data;

storing the data in the block with a first error correction code when the number of the error bits is not larger than a predetermined reference value, the first error correction code having a predetermined error correction ability of the data; and storing the data in the block with a second error correction code when the number of the error bits is larger than the predetermined reference value, the second error correction code having an error correction ability of the data higher than that of the first error correction code;

wherein the method further comprises:

setting a first block pool and a second block pool as block pools to which blocks belong, the first block pool including a block that stores data with the first error correction code added, and the second block pool including a block that stores data with the second error correction code added, adding the first error correction code to the data and storing the data in the block that belongs to the first block pool, performing error correction of the data stored in the block that belongs to the first block pool and counting the number of error bits in the block, migrating the data stored in the block to another block that belongs to the first block pool or the second block pool and performing batch-erasure of the block when the number of the error bits of the block is larger than a first reference value, and changing the block pool to which the block belongs to the second block pool when the number of the error bits of the block is larger than a second reference value higher the first reference value.

\* \* \* \* \*